United States Patent
Xiang et al.

(12) 
(10) Patent No.: US 6,893,929 B1
(45) Date of Patent: May 17, 2005

(54) METHOD OF FORMING STRAINED SILICON MOSFET HAVING IMPROVED THRESHOLD VOLTAGE UNDER THE GATE ENDS

(75) Inventors: Qi Xiang, San Jose, CA (US); Ming Ren Lin, Cupertino, CA (US); Minh V. Ngo, Fremont, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/641,548

(22) Filed: Aug. 15, 2003

(51) Int. Cl.$^7$ .......................................... H01L 21/336
(52) U.S. Cl. ...................................... 438/303; 438/933
(58) Field of Search ............................... 438/303, 312, 438/318, 366, 424, 700, 735, 739, 933

(56) References Cited

U.S. PATENT DOCUMENTS 6,576,558 B1 * 6/2003 Lin et al. .................. 438/700
6,590,271 B2 * 7/2003 Liu et al. ................... 257/510
6,686,255 B2 * 2/2004 Yang et al. ................. 438/439

* cited by examiner

*Primary Examiner*—Phuc T. Dang
(74) *Attorney, Agent, or Firm*—Foley & Lardner LLP

(57) ABSTRACT

The formation of shallow trench isolations in a strained silicon MOSFET includes implantation of a dopant into overhang portions of the strained silicon layer and silicon germanium layer at the edges of trenches in which shallow trench isolations are to be formed. The conductivity type of the dopant is chosen to be opposite the conductivity type of the source and drain dopants. The implanted dopant increases the threshold voltage Vt beneath the ends of the gate in overhang portions of the strained silicon layer so that it is approximately equal to or greater than that of the remainder of the MOSFET. The resulting strained silicon MOSFET exhibits reduced leakage current beneath the ends of the gate.

21 Claims, 7 Drawing Sheets

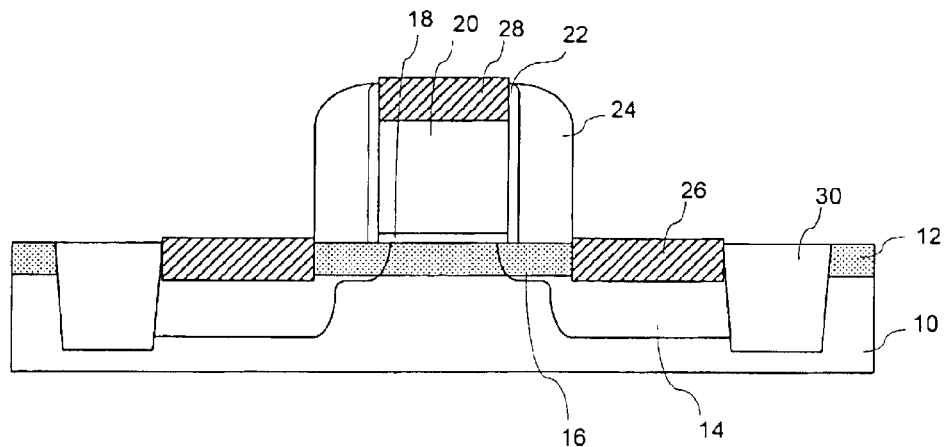
**Figure 1
Prior Art**
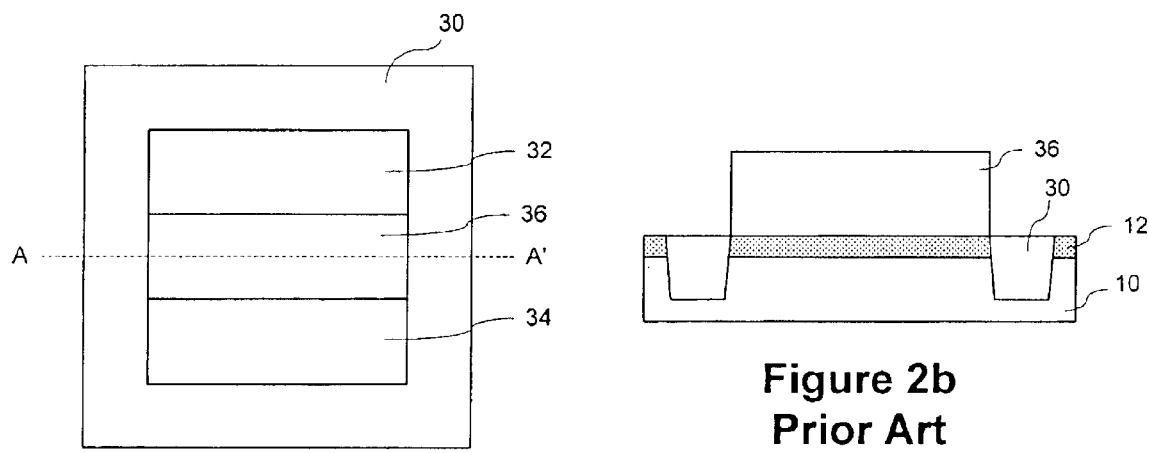
**Figure 2a
Prior Art**
**Figure 2b
Prior Art**

METHOD OF FORMING STRAINED SILICON MOSFET HAVING IMPROVED THRESHOLD VOLTAGE UNDER THE GATE ENDS

BACKGROUND OF THE INVENTION

1. Field of the Invention

The present invention relates to semiconductor integrated circuits, and in particular to semiconductor devices that incorporate strained silicon.

2. Related Technology

The continuous demand for improved performance in electronic devices has been addressed through advances in silicon processing and device technologies directed toward reduction in the size of individual semiconductor circuit components. However, economic and physical constraints are making continued reduction of device sizes more difficult, and so alternative solutions are being sought to allow increases in device performance to continue.

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is more widely spaced on average than a pure silicon lattice because of the presence of the larger germanium atoms in the lattice. Since the atoms of the silicon lattice align with the more widely spaced silicon germanium lattice, a tensile strain is created in the silicon layer. The silicon atoms are essentially pulled apart from one another. The amount of tensile strain applied to the silicon lattice increases with the proportion of germanium in the silicon germanium lattice.

The tensile strain applied to the silicon lattice increases carrier mobility. Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET using a strained silicon layer is shown in FIG. 1. The MOSFET is fabricated on a substrate comprising a silicon germanium layer 10 on which is grown an epitaxial layer of strained silicon 12. The MOSFET uses conventional MOSFET structures including deep source and drain regions 14, shallow source and drain extensions 16, a gate oxide layer 18, a gate 20 surrounded by spacers 22, 24, silicide source and drain contacts 26, a silicide gate contact 28, and shallow trench isolations 30. The channel region of the MOSFET includes the strained silicon material, which provides enhanced carrier mobility between the source and drain.

While the incorporation of strained silicon in MOSFETs enhances some aspects of MOSFET performance, other aspects of MOSFET performance are degraded. One source of performance degradation is a decrease in the threshold voltage Vt under then gate at the edges of the active area, which results in an enhanced leakage current at the ends of the gate. The mechanism that produces this effect is explained with reference to FIGS. 2a–2d. FIG. 2a shows a generalized plan view of the strained silicon MOSFET of FIG. 1. In this view it is seen that the shallow trench isolations 30 surround an active area in which are formed a source region 32 and drain region 34. The gate structure 36 bisects the active area between the source region 32 and the drain region 34. FIG. 2b shows a cross section of the MOSFET of FIG. 2a taken along line A-A'. As shown in FIG. 2b, the gate structure 36 and the strained silicon layer 12 span the distance between the shallow trench isolations 30.

The view of FIG. 2b is idealized, in that the shallow trench isolations 30 are shown as having essentially linearly tapered sidewall profiles. However, in actual implementations such linearity is difficult to achieve using conventional processing. The difficulty arises from the differences in the etch rates of silicon and silicon germanium. Typically a single etch chemistry such as $HBr/Cl_2He/O_2$ is used to etch both the strained silicon and the silicon germanium. However, this chemistry etches the material of the strained silicon layer 12 at a slower rate than the material of the silicon germanium layer 10. As a result, significant undercutting of the silicon germanium 10 occurs. As shown in FIG. 2c, this undercutting creates a strained silicon overhang portion 38. The strained silicon overhang portion 38 is sandwiched between the gate insulator 18 and the insulating material of the shallow trench isolation 30. FIG. 2d shows a cross section of the structure of FIG. 2c taken along line B-B'. As shown in FIG. 2d, the overhang portion 38 of the strained silicon layer effectively forms the channel region of a silicon on insulator (SOI) structure that is comprised of the gate 20, the gate insulator 18, and an SOI substrate consisting of the portion of the shallow trench isolation 30 that underlies the strained silicon overhang portion 38. Because the strained silicon layer is thin, typically 200 Angstroms or less, the depletion region 40 between the source and drain regions of the MOSFET extends through the entire thickness of the strained silicon overhang portion 38, resulting in a fully depleted silicon on insulator structure beneath each end of the gate. This is highly undesirable since the threshold voltage Vt in the region of the fully depleted SOI structure is significantly lower than the threshold voltage in the remainder of the MOSFET, resulting in unacceptable leakage current at the ends of the gate.

Therefore, strained silicon MOSFETs fabricated in accordance with conventional technology gain the benefit of enhanced carrier mobility but are degraded by greater leakage current in the regions under the ends of the gate.

SUMMARY OF THE INVENTION

It is an object of the invention to provide a strained silicon MOSFET that incorporates strained silicon without substantially reducing the threshold voltage or increasing the leakage current in regions beneath the ends of the gate.

In accordance with embodiments of the invention, the formation of shallow trench isolations in a strained silicon MOSFET includes implantation of a dopant into the overhang portions of the strained silicon layer and silicon germanium layer at the edges of isolation trenches prior to filling of the trenches with oxide. The dopant increases the threshold voltage Vt beneath the ends of the gate in the overhang portions so that it is approximately equal to or greater than that of the remainder of the MOSFET. The strained silicon MOSFET subsequently formed experiences reduced leakage beneath the ends of the gate.

In accordance with one embodiment of the invention, a strained silicon MOSFET having a reduced leakage current is fabricated. Initially a substrate is provided. The substrate includes a first layer of silicon germanium and a layer of strained silicon grown on the layer of silicon germanium. Etching is then performed to form trenches for shallow trench isolations in the strained silicon and silicon germanium layers. Following formation of the trenches, a dopant opposite in conductivity to the dopant to be used for the source and drain regions of the MOSFET is implanted into the trench sidewalls. The dopant is preferably implanted at an angle, using an energy of implantation that causes the dopant to penetrate the strained silicon layer and silicon germanium layer to a depth sufficient to provide doping in at least any portion of those layers that will overhang the shallow trench isolations, and that may therefore be in a fully depleted state in the absence of doping. The introduction of the dopant increases the threshold voltage Vt in the overhang regions. Shallow trench isolations are then formed in the trenches, and a MOSFET comprising the strained silicon layer is then formed in an active area defined by the shallow trench isolations. The processing to form the MOSFET typically includes patterning of a gate and gate insulator, implantation of shallow source and drain extensions and deep source and drain regions, and formation of source, drain and gate silicides. Other processing may also be performed.

DESCRIPTION OF THE DRAWINGS

Embodiments of the invention are described in conjunction with the following drawings, in which:

FIG. 1 shows a MOSFET using a layer of strained silicon formed in accordance with conventional processing;

FIGS. 2a, 2b, 2c and 2d show additional views of the MOSFET of FIG. 1;

DESCRIPTION OF PREFERRED EMBODIMENTS

Figure 2C:
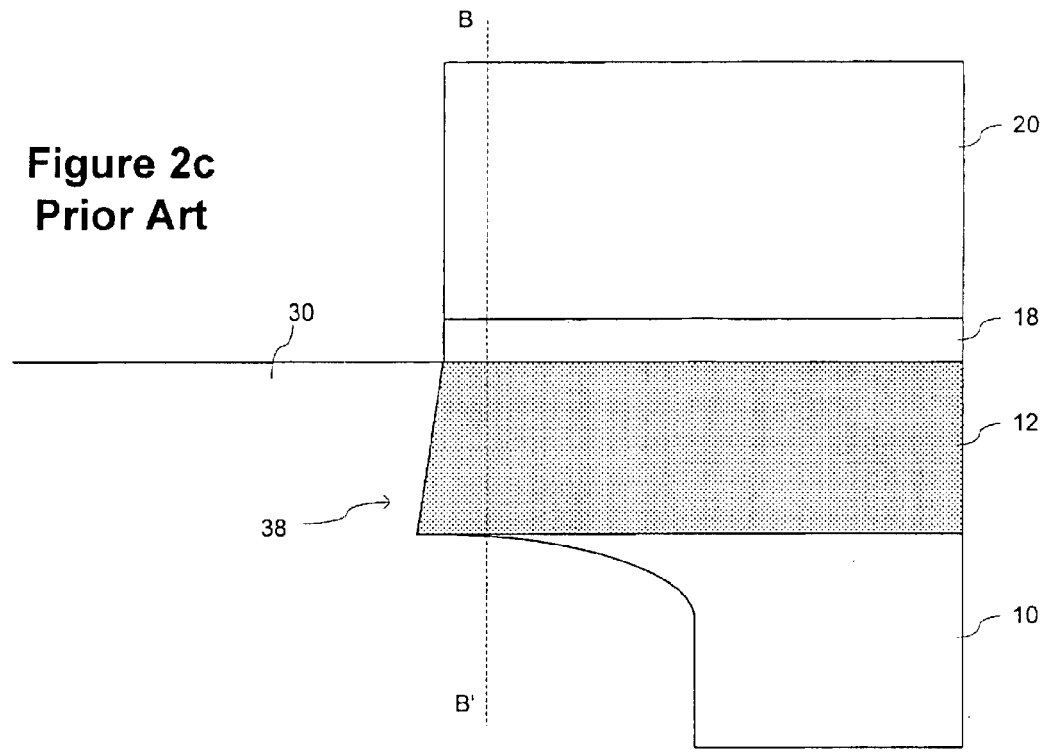
Figure 2D:
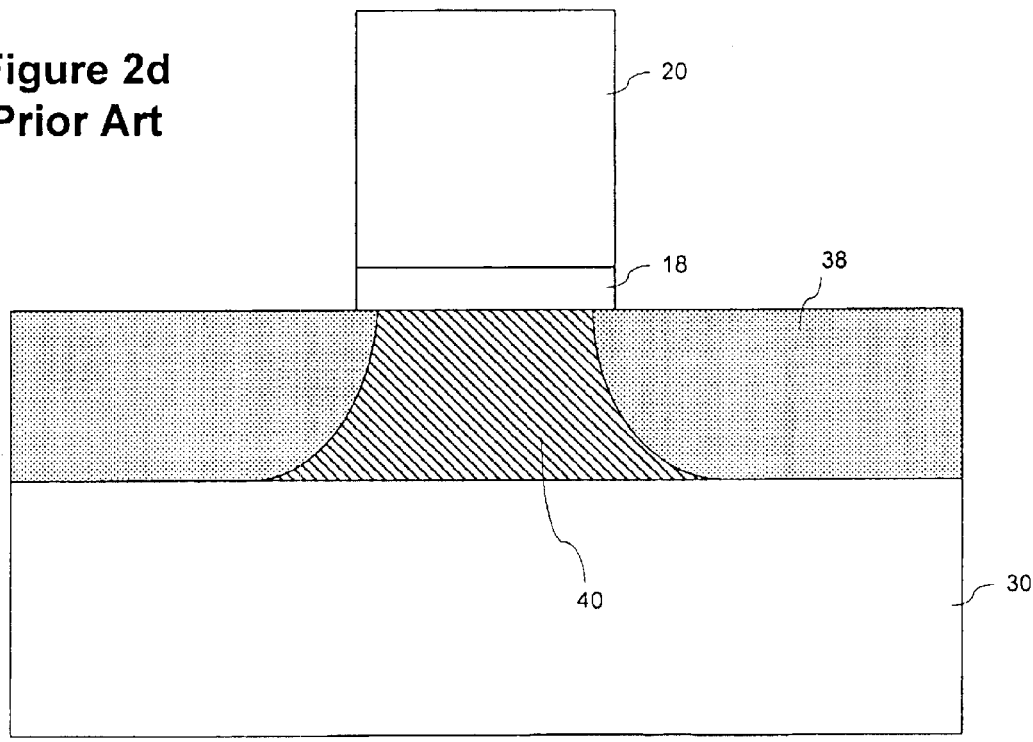
Figure 3A:
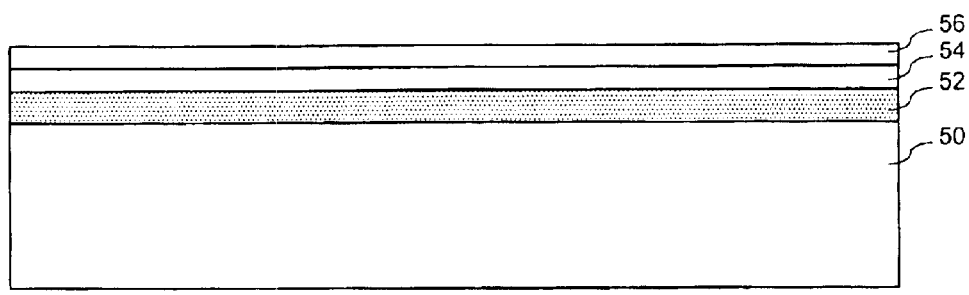
FIGS. 3a, 3b, 3c, 3d, 3e, 3f, 3g, 3h, 3i, 3j and 3k show structures formed during production of a MOSFET in accordance with a preferred embodiment of the invention.

FIGS. 3a–3k show structures formed during fabrication of a strained silicon MOSFET in accordance with a preferred embodiment of the invention. FIG. 3a shows a structure comprising a silicon germanium layer 50. The silicon germanium layer 50 preferably has a composition $Si_{1-x}Ge_x$, where x is approximately 0.2, and is more generally in the range of 0.1 to 0.3. The silicon germanium layer 50 is typically grown on and supported by a silicon wafer (not shown). Silicon germanium may be grown, for example, by chemical vapor deposition using $Si_2H_6$ (disilane) and $GeH_4$ (germane) as source gases, with a substrate temperature of 600–900 degrees C, a $Si_2H_6$ partial pressure of 30 mPa, and a $GeH_4$ partial pressure of 60 mPa. $SiH_4$ (silane) may be used in alternative processes. Growth of the silicon germanium layer 50 may be initiated using these ratios, or alternatively the partial pressure of $GeH_4$ may be gradually increased beginning from a lower pressure or zero pressure to form a gradient composition having the desired germanium content (e.g. 20%) at an upper portion that will form a junction with a later formed strained silicon layer.

A strained silicon layer 52 is grown on the silicon germanium layer 50. The strained silicon layer 52 is preferably grown by selective epitaxial growth through a chemical vapor deposition (CVD) process, for example using $Si_2H_8$ as a source gas with a partial pressure of 30 mPa and a substrate temperature of approximately 600 to 900 degrees C. The strained silicon layer 52 and the silicon germanium layer 50 are preferably grown in a single continuous in situ deposition process. This may be achieved by discontinuing the flow of germanium source gas (e.g. germane) into the deposition chamber after a desired thickness of silicon germanium has been grown in order to the change the composition of the deposited material from silicon germanium to silicon.

Formed on the strained silicon layer 52 is a bi-layer hardmask structure comprising a bottom hardmask layer 54, also referred to as a bottom antireflective coating (BARC), and an upper hardmask layer 56. The bottom hardmask layer 54 is typically silicon oxide (e.g. $SiO_2$) and the upper hardmask layer 56 is typically silicon nitride (e.g. $Si_3N_4$).

Figure 3B:
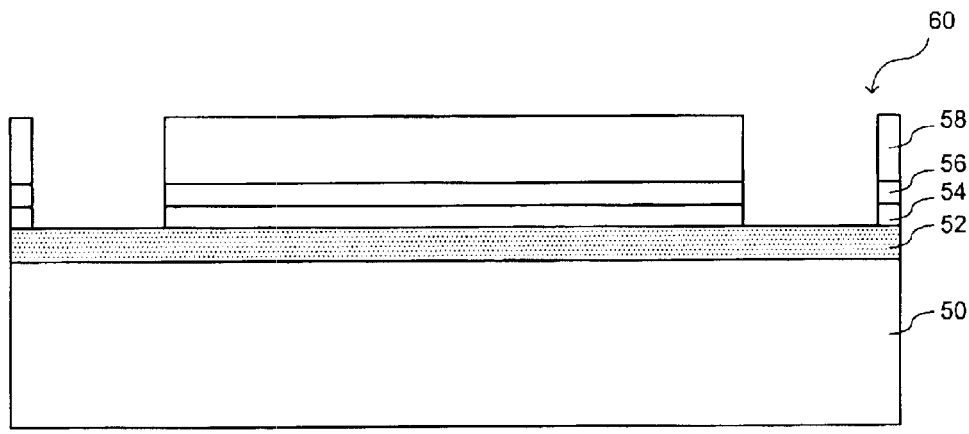

FIG. 3b shows the structure of FIG. 3a after patterning of the bi-layer hardmask using a photoresist mask 58 as an etch mask to form openings 60 in the bi-layer hardmask. The openings 60 correspond to the locations of shallow trench isolations to be formed in the strained silicon layer 52 and silicon germanium layer 50 to define active areas for formation of MOSFETs. In some instances it may be desirable to perform ion implantation is performed to damage the crystal lattice of the strained silicon layer 52 so that the etch rate of the strained silicon is increased and less undercutting of the silicon germanium occurs. A variety of ions may be used, including silicon, germanium, argon, and nitrogen. The energy of implantation is chosen so that substantially the entire thickness of the strained silicon layer is damaged by the implantation. The dose is chosen so that the damage caused by the implantation increases the rate at which the strained silicon will be etched so that its etch rate is substantially the same as the etch rate of the underlying silicon germanium. It is preferred to retain the photoresist mask 58 on top of the bi-layer hardmask during such ion implantation to protect the bi-layer hardmask materials from the damaging effects of the implantation.

Figure 3C:
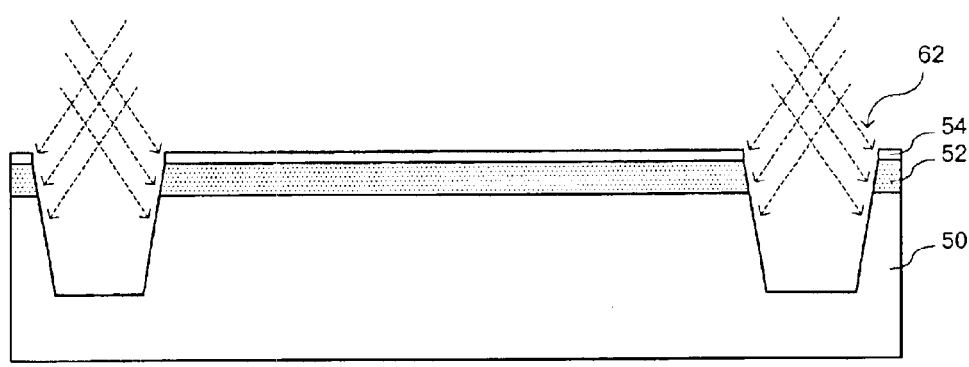
Figure 3D:
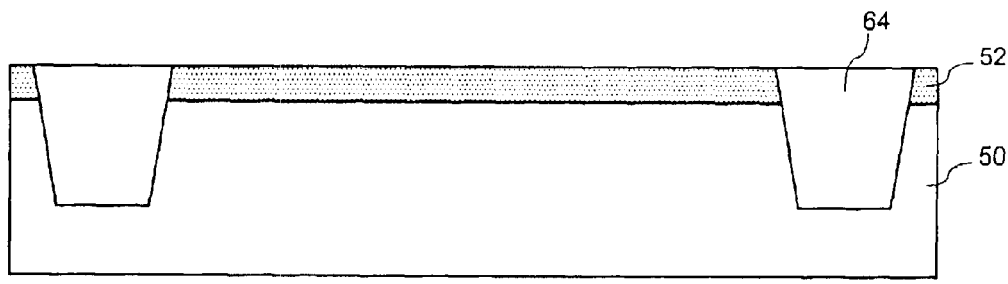

FIG. 3c shows the structure of FIG. 3b after etching of the strained silicon layer 52 and the silicon germanium layer 50 to form trenches 62 having tapered sidewalls. As shown in FIG. 3c, an angled implant is performed on the trench sidewalls to introduce a dopant that increases the threshold voltage Vt in the overhang regions. The dopant is chosen to have the same conductivity type as the dopant of the channel region. For example, in NMOS devices it is preferred to use boron, while in PMOS devices it is preferred to use arsenic. In one example, an NMOS having a deep source and drain is to be formed with a shallow source and drain extension using an arsenic implant dose of $1\times10^{14}$ to $1\times10^{15}$ cm$^{-2}$. To counteract degradation beneath the gate ends, angled implantation is performed on the trench sidewalls using boron in a dose of $5\times10^{13}$ to $5=10^{14}$ cm$^{-2}$, with the precise dose depending on the thickness of the strained silicon layer 52. The energy of implantation is preferably chosen to penetrate the strained silicon layer 52 and silicon germanium layer 50 to a depth sufficient to provide doping in at least any portion of those layers that will overhang the shallow trench isolations and otherwise be in a fully depleted state. As shown in FIG. 3c, the etching process tends to consume some of the material of the bi-layer hardmask, typically leaving a portion of the bottom silicon oxide layer 54. A portion of the upper silicon nitride layer 56 may also remain. It is preferable that these portions of the bi-layer hardmask remain in place during implantation of dopant to protect the remainder of the strained silicon layer. Typically the energy of implantation used to implant the dopant is insufficient to penetrate the remaining portions of the bi-layer hardmask, FIG. 3d shows the structure of FIG. 3c after formation of shallow trench isolations 64 in the trenches. The shallow trench isolations may be formed by performing a brief thermal oxidation of the exposed stained silicon and silicon germanium in the trenches, followed by deposition of a layer of silicon oxide to a thickness that is sufficient to fill the trenches, such as by low pressure CVD (LPCVD) TEOS or atmospheric pressure ozone TEOS. The silicon oxide layer is then densified, and an overburden portion is removed such as by chemical mechanical polishing or an etch back process, leaving shallow trench isolations 64 that are approximately level with the surface of the strained silicon layer 52. Where only silicon oxide material remains from the bi-layer hardmask after etching of the trenches, the silicon oxide layer for the shallow trench isolations may be deposited directly over the residual silicon oxide hardmask material. Where material of the upper layer of the bi-layer hardmask such as silicon nitride remains after etching of the trenches, it may be preferred to remove at least the silicon nitride prior to deposition of silicon oxide in order to simplify later removal of the silicon oxide overburden by chemical mechanical polishing or etch back.

Figure 3E:
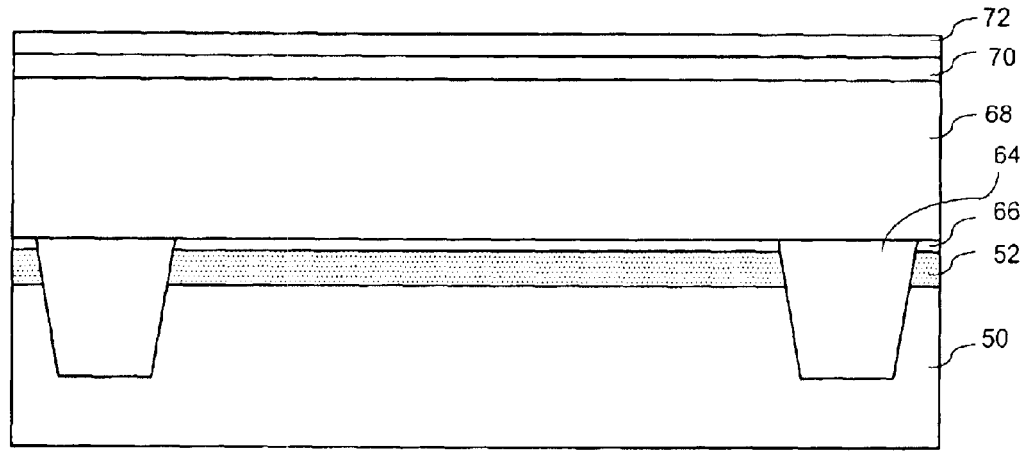
Figure 3F:
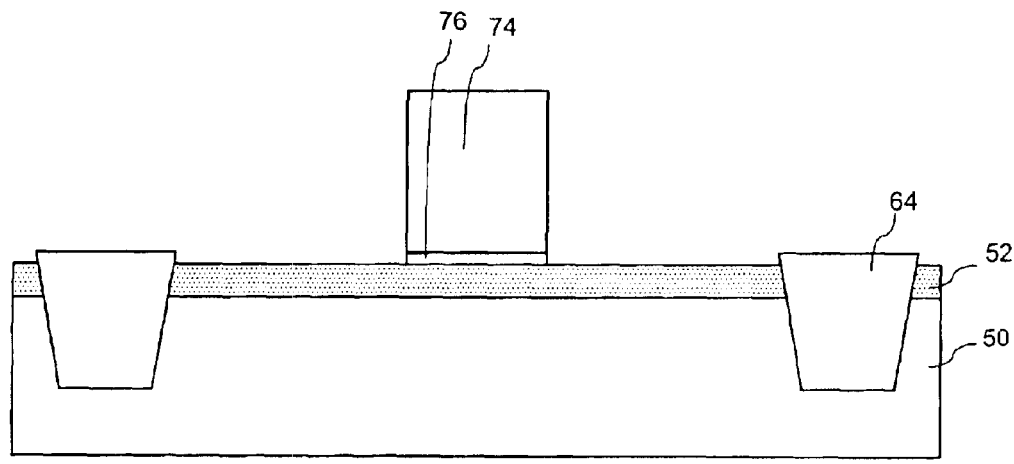

FIG. 3e shows the structure of FIG. 3d after formation of several layers of different materials over the strained silicon layer 52. The layers of material that are formed include a gate insulating layer 66 that is formed on the strained silicon layer 52. The gate insulating layer 66 is typically silicon oxide but may be another material such as silicon oxynitride. An oxide may be grown by thermal oxidation of the strained silicon layer 52, or may be deposited by chemical vapor deposition. Formed over the gate insulating layer 66 is a gate conductive layer 68. The gate conductive layer 68 typically comprises polysilicon but may alternatively comprise another material such as polysilicon implanted with germanium. Overlying the gate conductive layer 68 is a bi-layer hardmask structure comprising a bottom hardmask layer 70, also referred to as a bottom antireflective coating (BARC), and an upper hardmask layer 72. The bottom hardmask layer 70 is typically silicon oxide (e.g. $SiO_2$) and the upper hardmask layer 72 is typically silicon nitride (e.g. $Si_3N_4$), FIG. 3f shows the structure of FIG. 3e after patterning of the gate conductive layer and gate insulating layer to form a gate 74 and a self-aligned gate insulator 76. Patterning is performed using a series of anisotropic etches that patterns the upper hardmask layer using a photoresist mask as an etch mask, then patterns the lower hardmask layer using the patterned upper hardmask layer as an etch mask, then patterns the gate conductive layer using the patterned lower hardmask layer as an etch mask, then patterns the gate insulating layer using the gate 74 as a hardmask.

Figure 3G:
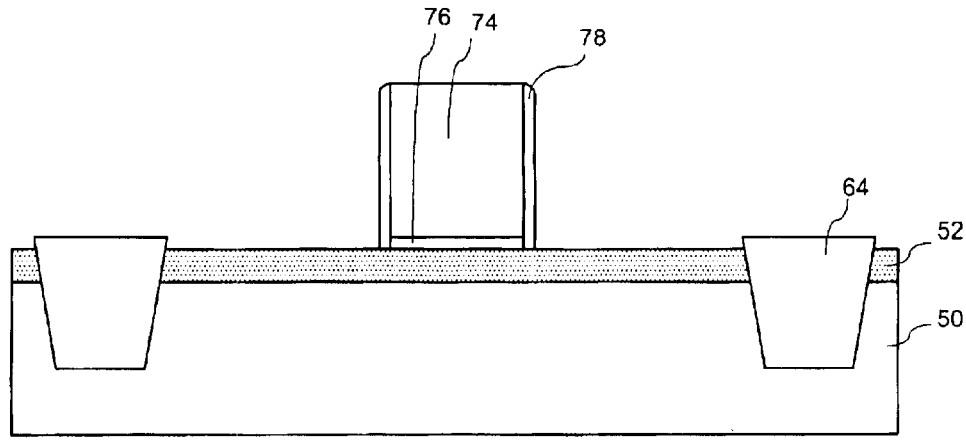

FIG. 3g shows the structure of FIG. 3f after formation of a thin first gate spacer 78 around the gate 74 and gate insulator 76. The thin first gate spacer 78 may be formed by oxidation of exposed silicon and polysilicon structures, and may oxidize a portion of the strained silicon layer to form a protective layer.

Figure 3H:
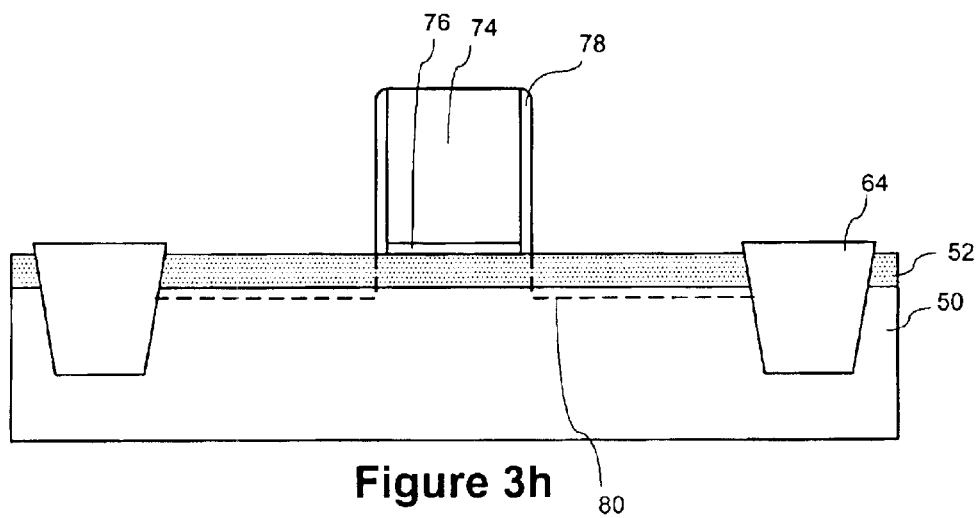

FIG. 3h shows the structure of FIG. 3g after implantation of dopant to form shallow source and drain extensions 80 in the strained silicon layer 52 at opposing sides of the channel region. The shallow source and drain extensions 80 typically extend into the silicon germanium layer 50 as shown in FIG. 3h. Halo regions (not shown) may be implanted prior to implantation of the shallow source and drain extensions. Halo regions are regions that are doped with a dopant that is opposite in conductivity to the dopant of the source and drain extensions 80. The halo regions help to suppress the short channel "punchthrough" effect by shortening the depletion regions at the ends of the source and drain extensions 80. The halo regions are preferably implanted using a low energy at a small angle to the surface of the substrate so that the halo regions extend beneath the gate 74 to beyond the anticipated locations of the ends of the source and drain extensions 80 after annealing. Like the source and drain extensions 80, the halo regions are formed at opposing sides of the channel region and extend toward the channel region beyond the ends of the source and drain extensions to be formed.

Figure 3I:
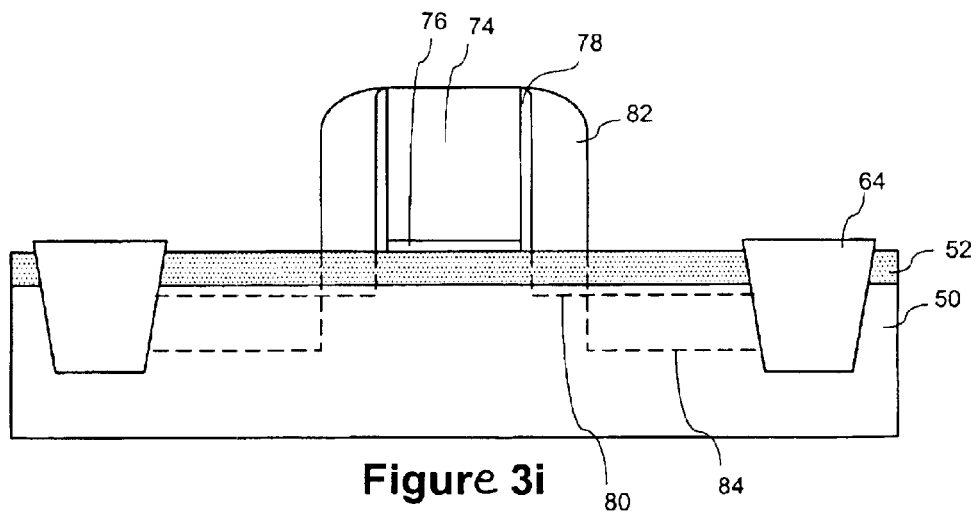

FIG. 3i shows the structure of FIG. 3h after formation of a second spacer 82 around the gate 74, the gate insulator 76, and the thin first spacer 78, followed by implantation of dopant to form deep source and drain regions 84 in the strained silicon 52 and silicon germanium 50 layers. The second spacer 82 serves as an implant mask during implantation of the deep source and drain regions 84 to define the position of the source and drain regions 84 relative to the channel region of the MOSFET. The depth of the deep source and drain regions 84 extends beyond the strained silicon layer 52 into the lower silicon germanium layer 50.

Figure 3J:
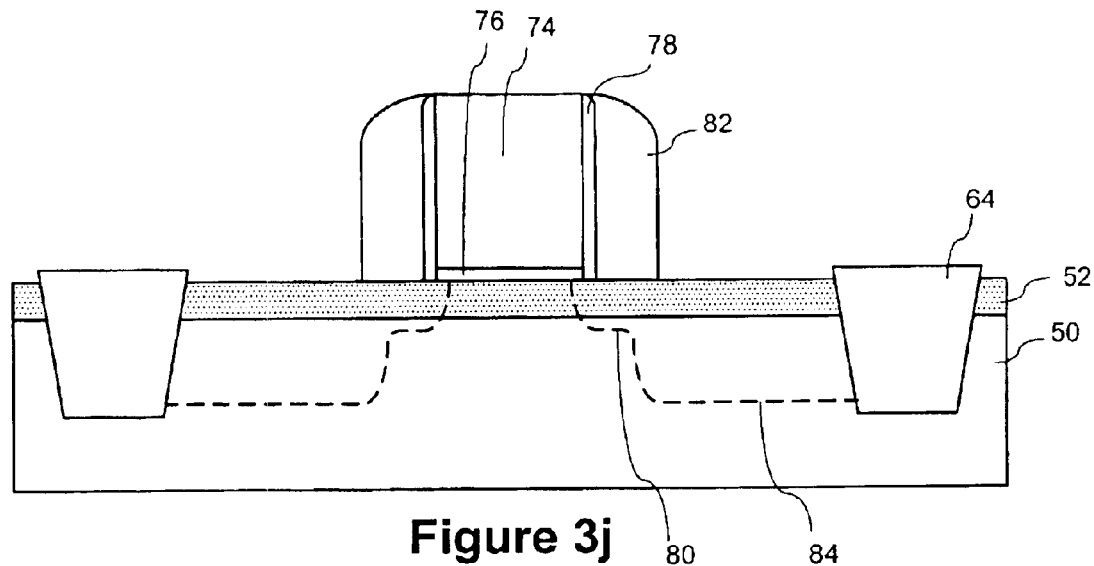

FIG. 3j shows the structure of FIG. 3i after performing rapid thermal annealing (RTA) to anneal the strained silicon layer 52 and silicon germanium layer 50 and to activate the dopants implanted in the shallow source and drain extensions 80 and the deep source and drain regions 84. During annealing some diffusion of implanted dopant occurs in the strained silicon layer 52 and the silicon germanium layer 50.

Figure 3K:
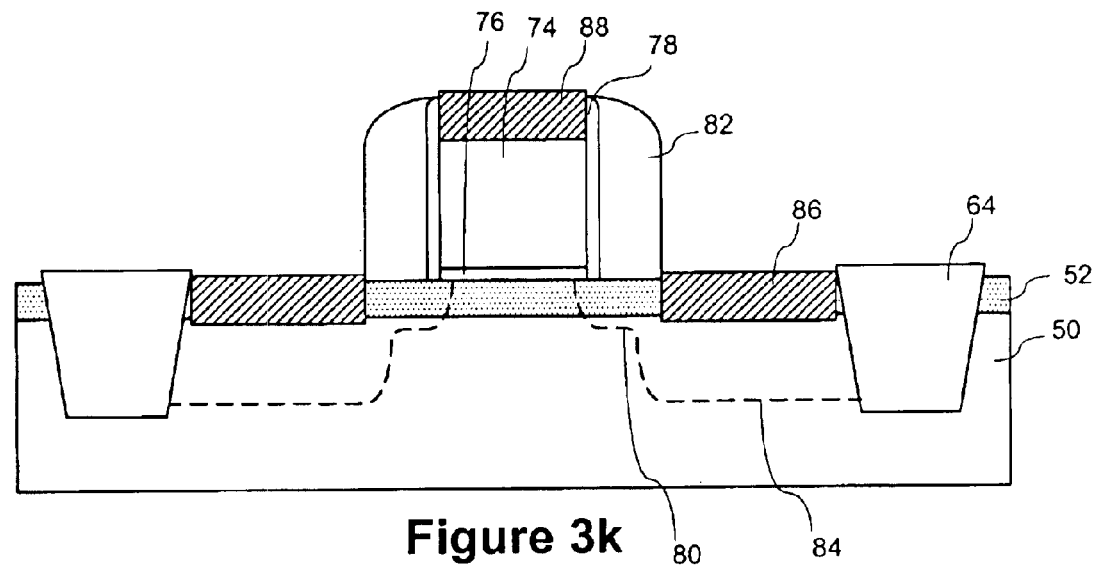

FIG. 3k shows the structure of FIG. 3i after formation of silicide contacts 86 on the source and drain regions 84 and formation of a silicide contact 88 on the gate 74. The silicide contacts are formed of a compound comprising a semiconductor material and a metal. Typically a metal such as cobalt (Co) is used, however other metals such as nickel (Ni) may also be employed. The silicide contacts are formed by depositing a thin conformal layer of the metal over the substrate, and then annealing to promote silicide formation at the points of contact between the metal and underlying semiconductor materials, followed by removal of residual metal.

While the processing of FIGS. 3a–3k is presently preferred, such processing does not exclude other additional processing that may be desirable in order to further enhance the performance of the strained silicon MOSFET. For example, in some applications it may be desired to grow a second layer of silicon germanium over the layer of strained silicon either prior to or after formation of the shallow trench isolations in order to provide additional support of the tensile strain of the strained silicon layer and to resist the creation of misfit dislocations. This may facilitate the growth of strained silicon layers that are thicker than the conventional thickness of strained silicon that can be maintained on a single silicon germanium layer without substantial defects. In addition, in PMOS devices, it may be desirable to replace the strained silicon of the source and drain regions with silicon germanium in order to avoid source and drain extension distortions caused by the increased diffusion rate of boron in silicon. Similarly, it may be desirable in NMOS devices to replace a portion of the silicon germanium layer encompassing the source and drain extensions with silicon in order to avoid source and drain extension distortions caused by the increased diffusion rate of arsenic in silicon germanium. The use of additional halo regions to encompass the shallow source and drain extensions and deep source and drain regions may also be employed to counteract undesirable diffusion. It may also be desirable to replace the silicon germanium that encompasses the deep source and drain regions with silicon in order to increase the junction voltage in those regions and reduce the parasitic capacitance of the device. Other types of processing may also be integrated with the processing of the preferred embodiment.

Figure 4:
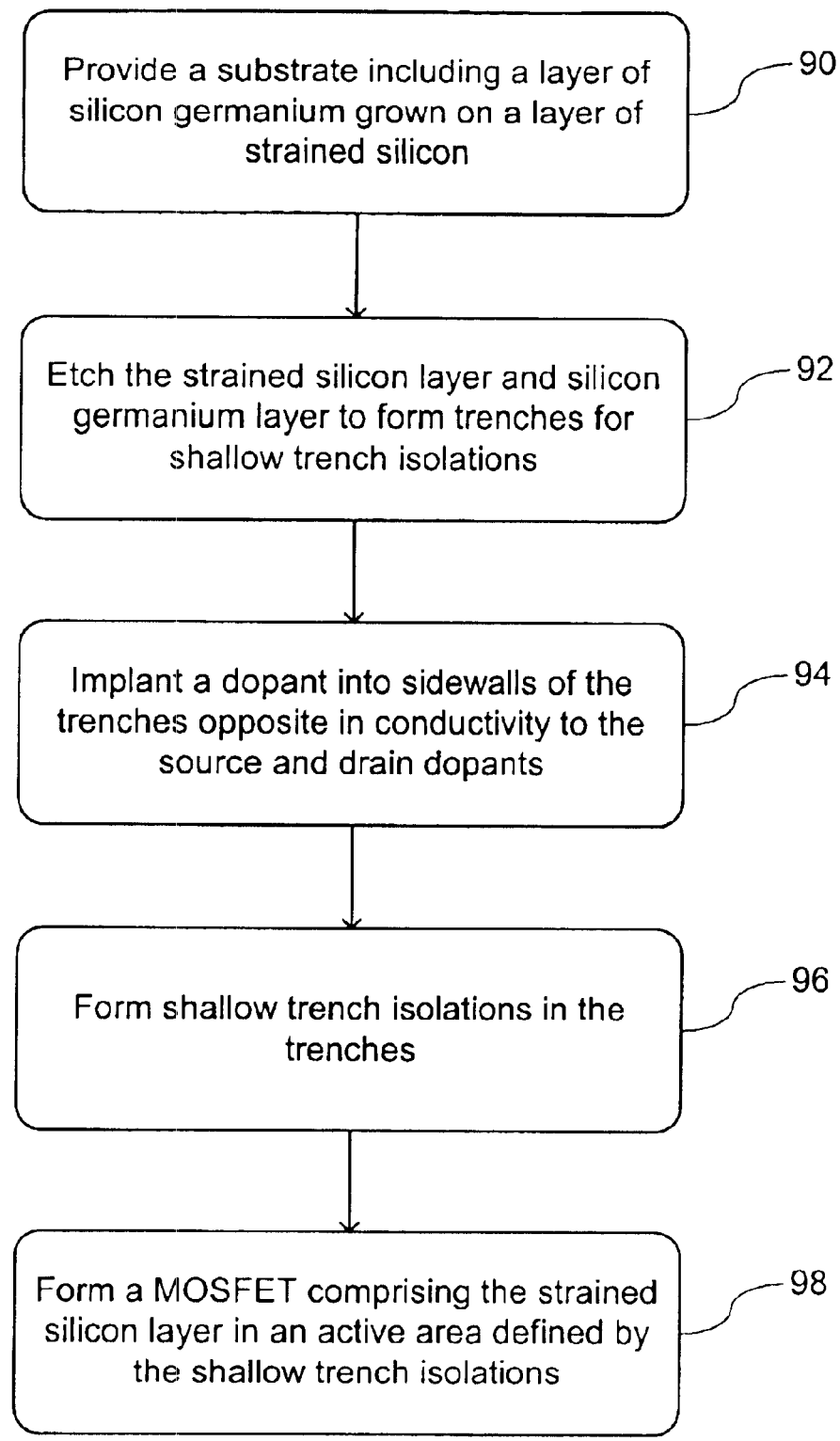
FIG. 4 shows a process flow encompassing the preferred embodiment and alternative embodiments.

FIG. 4 shows a process flow for forming a MOSFET that encompasses the preferred embodiment of FIGS. 3a–3k, the aforementioned additional processing and other alternatives. Initially a substrate is provided (90). The substrate includes a first layer of silicon germanium and a layer of strained silicon grown on the layer of silicon germanium. Etching is then performed to form trenches for shallow trench isolations in the strained silicon and silicon germanium layers (92). Following formation of the trenches, a dopant opposite in conductivity to the dopant to be used for the source and drain regions of the MOSFET is implanted into the trench sidewalls (94). The dopant is preferably implanted at an angle, using an energy of implantation that causes the dopant to penetrate the strained silicon layer and silicon germanium layer to a depth sufficient to provide doping in at least any portion of those layers that will overhang the shallow trench isolations and be otherwise in a fully depleted state. The introduction of the dopant into the trench sidewalls increases the threshold voltage Vt in the overhang regions. Shallow trench isolations are then formed in the trenches (96), and a MOSFET comprising the strained silicon layer is then formed in an active area defined by the shallow trench isolations (98). The processing to form the MOSFET typically includes patterning of a gate and gate insulator, implantation of shallow source and drain extensions and deep source and drain regions, and formation of source, drain and gate silicides. Other processing may also be performed.

A variety of additional features may also be desirable for particular implementations. To reduce germanium outgassing during shallow trench isolation formation, it may be desirable to form a thin silicon oxide layer in the trenches by rapid thermal oxidation (RTO) prior to performing high temperature processing for forming a thicker trench liner. Further, silicon may be formed on the trench walls prior to trench liner oxidation by selective growth, physical vapor deposition (PVD), or atomic layer deposition (ALD), and then oxidized. Alternatively, a silicon oxide layer may be grown as a trench liner by atomic layer deposition (ALD) or other deposition methods such as chemical vapor deposition (CVD).

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counterdoping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method of fabricating a metal oxide semiconductor field effect transistor (MOSFET), comprising:

providing a substrate comprising a layer of strained silicon grown on a layer of silicon germanium;

etching the strained silicon layer and the silicon germanium layer to form trenches for shallow trench isolations in the strained silicon layer and the silicon germanium layer;

implanting a dopant that is opposite in conductivity to a dopant to be used for source and drain regions of the MOSFET into sidewalls of the trenches;

forming shallow trench isolations in the trenches; and forming a MOSFET comprising the strained silicon layer in an active area defined by the shallow trench isolations.

2. The method recited in claim 1, wherein the implanted dopant is implanted at an angle to the trench sidewalls.

3. The method claimed in claim 1, wherein the implantation is performed using an energy of implantation that causes the dopant to penetrate the strained silicon layer and silicon germanium layer to a depth sufficient to provide doping in at least any portion of the strained silicon layer and the silicon germanium layer that will overhang shallow trench isolations formed in the trench and that will be otherwise in a fully depleted state.

4. The method claimed in claim 1, wherein the first silicon germanium layer has a composition $Si_{1-x}Ge_x$, where x is in the range of 0.1 to 0.3.

5. The method claimed in claim 1, wherein forming said MOSFET comprises:

forming a gate insulating layer on the strained silicon layer;

forming a gate conductive layer on the gate insulating layer;

patterning the gate conductive layer to form a gate.

6. The method claimed in claim 5, wherein forming said MOSFET further comprises:

forming a first spacer around the gate; and implanting shallow source and drain extensions.

7. The method claimed in claim 6, wherein implanting shallow source and drain extensions is preceded by implanting halo regions, the halo regions extending toward a channel region beyond ends of the source and drain extensions to be formed, the halo regions comprising a dopant having a conductivity type opposite to the conductivity type of a dopant of the source and drain extensions.

8. The method claimed in claim 7, wherein forming the MOSFET further comprises:

forming a second spacer around the first spacer; and implanting deep source and drain regions, wherein the second spacer serves as an implantation mask during implanting of the deep source and drain regions.

9. The method claimed in claim 8, wherein forming the MOSFET further comprises:

forming silicide source and drain contacts and a silicide gate contact.

10. The method claimed in claim 9, wherein the silicide source and drain contacts and the silicide gate contact comprise nickel.

11. The method claimed in claim 10, wherein forming silicide source and drain contacts and a silicide gate contact is preceded by annealing to activate implanted dopants.

12. The method claimed in claim 1, wherein providing the substrate comprises growing a layer of silicon germanium on a semiconductor substrate.

13. The method claimed in claim 12, further comprises growing a layer of strained silicon on the layer of silicon germanium.

14. The method claimed in claim 13, wherein the layer of silicon germanium and the layer of strained silicon are grown together in a single continuous in situ deposition process.

15. The method claimed in claim 1, wherein the strained silicon layer and silicon germanium layer are etched using a bi-layer hardmask formed on the strained silicon layer.

16. The method claimed in claim 15, wherein at least a portion of the bi-layer hardmask remains on the strained silicon layer to protect the strained silicon layer during implanting of said dopant.

17. A MOSFET device formed in accordance with the method recited in claim 1.

18. A method of fabricating a metal oxide semiconductor field effect transistor (MOSFET), comprising:

provided a substrate comprising a layer of strained silicon grown on a layer of silicon germanium;

etching the strained silicon layer and the silicon germanium layer to form trenches for shallow trench isolations;

implanting a dopant opposite in conductivity to a dopant to be used for source and drain regions of the MOSFET into sidewalls of the trenches;

forming shallow trench isolations in the trenches; and forming a MOSFET comprising the strained silicon layer in an active area defined by the shallow trench isolations, wherein the dopant is implanted at an angle to the trench sidewalls, and wherein the implantation is performed using an energy of implantation that causes the dopant to penetrate the strained silicon layer and silicon germanium layer to a depth sufficient to provide doping in at least any portion of the strained silicon layer and the silicon germanium layer that overhangs the shallow trench isolations.

19. A MOSFET device formed in accordance with the method recited in claim 18.

20. A method of fabricating a metal oxide semiconductor field effect transistor (MOSFET), comprising:

providing a substrate comprising a layer of strained silicon grown on a layer of silicon germanium;

etching the strained silicon layer and the silicon germanium layer to form trenches;

implanting a dopant opposite in conductivity to a dopant to be used for source and drain regions of the MOSFET into sidewalls of the trenches;

forming shallow trench isolations in the trenches;

forming a gate and gate insulator on the strained silicon layer;

implanting shallow source and drain extensions;

implanting deep source and drain regions; and forming silicides on the gate and the source and drain regions, wherein the implantation of the dopant is performed using an energy of implantation that causes the dopant to penetrate the strained silicon layer and silicon germanium layer to a depth sufficient to provide doping in at least any portion of the strained silicon layer and the silicon germanium layer that overhangs the shallow trench isolations.

21. A MOSFET device formed in accordance with the method recited in claim 20.

* * * * *